US008488357B2

(12) United States Patent
Sunaga et al.

(10) Patent No.: US 8,488,357 B2
(45) Date of Patent: Jul. 16, 2013

(54) REFERENCE CELL ARCHITECTURES FOR SMALL MEMORY ARRAY BLOCK ACTIVATION

(75) Inventors: Toshio Sunaga, Ohtsu (JP); Lejan Pu, San Jose, CA (US); Perng-Fei Yuh, San Jose, CA (US); Chao-Hung Chang, Gilroy, CA (US)

(73) Assignee: MagIC Technologies, Inc., Milpitas, CA (US)

( * ) Notice: Subject to any disclaimer, the term of this patent is extended or adjusted under 35 U.S.C. 154(b) by 311 days.

(21) Appl. No.: 12/925,492

(22) Filed: Oct. 22, 2010

(65) Prior Publication Data
US 2012/0099358 A1 Apr. 26, 2012

(51) Int. Cl.
*G11C 5/08* (2006.01)

(52) U.S. Cl.
USPC ............... 365/66; 365/63; 365/51; 365/171; 365/173

(58) Field of Classification Search
USPC ................. 365/66, 63, 51, 171, 173
See application file for complete search history.

(56) References Cited

U.S. PATENT DOCUMENTS

| | | | | |
|---|---|---|---|---|
| 6,459,626 B1* | 10/2002 | Bohm et al. | ............. | 365/185.15 |
| 6,509,787 B1* | 1/2003 | Kang | ............. | 327/541 |
| 6,608,776 B2* | 8/2003 | Hidaka | ............. | 365/171 |
| 6,807,089 B2 | 10/2004 | Gogl et al. | | |
| 7,453,719 B2 | 11/2008 | Sakimura et al. | | |
| 2002/0080644 A1* | 6/2002 | Ito | ............. | 365/158 |
| 2005/0281080 A1 | 12/2005 | Dray et al. | | |
| 2006/0098478 A1 | 5/2006 | Ezaki et al. | | |
| 2007/0247939 A1 | 10/2007 | Nahas et al. | | |
| 2008/0225582 A1 | 9/2008 | Hidaka | | |
| 2010/0157656 A1 | 6/2010 | Tsuchida | | |
| 2012/0069644 A1* | 3/2012 | Pu et al. | ............. | 365/163 |

OTHER PUBLICATIONS

"A Low-Impedance Open-Bitline Array for Multigigabit DRAM," by Tomonori Sekiguchi et al., IEEE Journal of Solid-State Circuits, vol. 37, No. 4, Apr. 2002, pp. 487-498.
ISSCC 88 / Friday, Feb. 19, 1988 / Continental Ballroom 5 / 11:45 AM, Session XVI: Dynamic Memory, FAM 16.6: "A 16Mb DRAM with an Open Bit-Line Architecture," by Michihiro Inoue et al., 3 pgs.
"A 1.2V 1Mbit Embedded MRAM Core with Folded Bit-Line Array Architecture," by Takajaru Tsuji et al., 2004 Symposium on VLSI Circuits Digest of Technical Papers, 26.4, 2004 IEEE, 0-7803-8287-0/04, pp. 450-453.

(Continued)

*Primary Examiner* — Connie Yoha
(74) *Attorney, Agent, or Firm* — Saile Ackerman LLC; Stephen B. Ackerman

(57) ABSTRACT

Systems and methods for realizing reference currents to improve reliability of sensing operations of segmented semiconductor memory arrays have been achieved. Preferred embodiments of the invention comprise MRAM arrays but the invention could be applied to any other memories requiring access on small, segmented arrays. All embodiments of the invention comprise a folded bit lines scheme, either in adjacent bit lines or in segment-to-segment folded bit lines. In two embodiments alternate strapping of Poly-Si Word Lines in every second segment is achieved by metal layer of Read Word Line and Write Select Line. An embodiment has stored 1 and 0 cells on both sides of a selected segment to be read.

29 Claims, 7 Drawing Sheets

OTHER PUBLICATIONS

"A 250-MHz 1-Mbit Embedded MRAM Macro Using 2T1MTJ Cell with Bitline Separation and Half-Pitch Shift Architecture," by Noboru Sakimura et al., IEEE Asian Solid-State Circuits Conference, Nov. 12-14, 2007 / Jeju, Korea, 2007 IEEE, 7-4, pp. 216-219.

"A 1-Mbit MRAM Based on 1T1MTJ Bit Cell Integrated With Copper Interconnects," by Mark Durlam et al., IEEE Journal of Solid-State Circuits, vol. 38, No. 5, May 2003, pp. 769-773.

"A High-Speed 128-kb MRAM Core for Future Universal Memory Applications," by John Debrosse et al., IEEE Journal of Solid-State Circuits, vol. 39, No. 4, Apr. 2004, pp. 678-683.

PCT Search Report—PCT/US2011/001780 Mail date- Mar. 19, 2012, Magic Technologies, Inc.

* cited by examiner

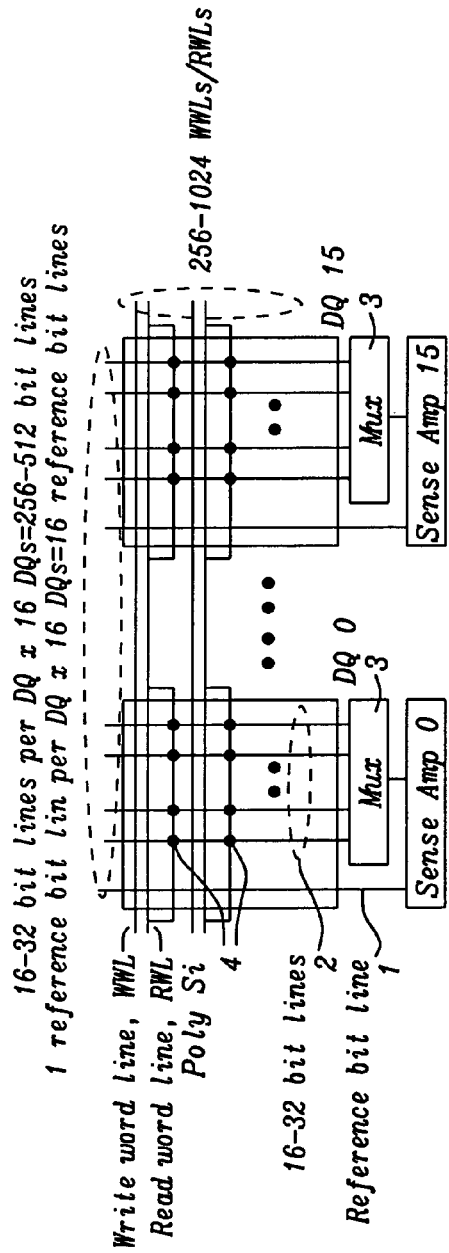
FIG. 1a – Prior Art
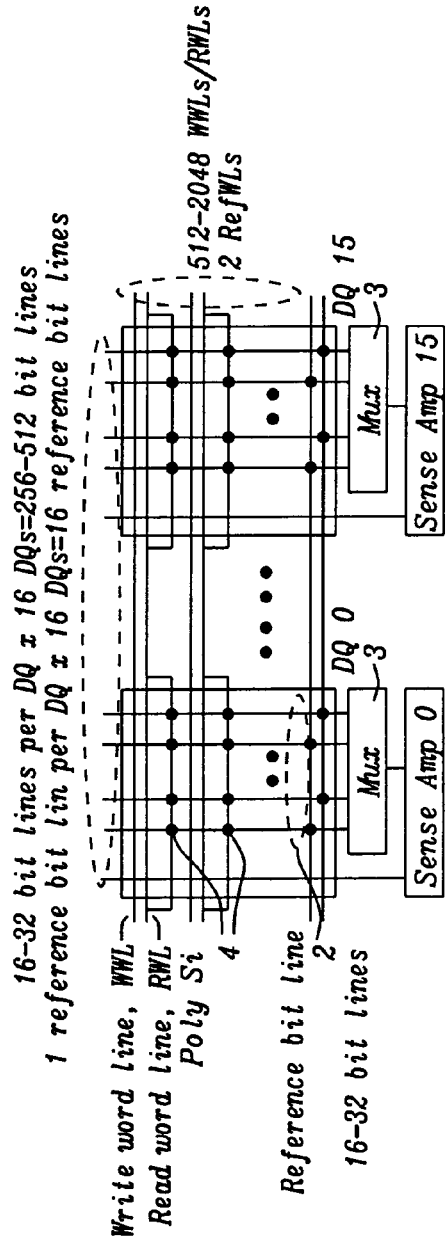
FIG. 1b – Prior Art

REFERENCE CELL ARCHITECTURES FOR SMALL MEMORY ARRAY BLOCK ACTIVATION

BACKGROUND OF THE INVENTION (1) Field of the Invention

This invention relates generally to memory products and relates more specifically to reference cell architectures for memories that need to activate small array blocks.

(2) Description of the Prior Art

In read operation of memory chips, a sense amplifier compares a stored signal with a reference signal. This concept applies to all of the semiconductor memories except those that store true and complement data in a cell such as SRAM's and twin-cell memories. The reference signal is created to provide the middle voltage or current level between stored 1 and 0 of the memory data. Although its storage mechanism exploits magnetization, a sensing operation of Magnetic Random Access Memories (MRAM) using Magnetic Tunnel Junction (MTJ) also compares the current of a stored cell with that of the reference, because magnetization direction of the free layer, either parallel or anti-parallel to the fixed layer, causes a difference in electrical resistance across MTJ, and this can be detected as the difference in current.

FIGS. 1a+b prior art show examples how the reference signal is generated in conventional MRAMs. FIG. 1a prior art shows a conventional MRAM Array structure in regard of a reference bit line. FIG. 1b prior art shows a conventional MRAM Array structure in regard of a reference bit word line.

It is assumed that the memory in the example of FIGS. 1a+b prior art has 16 data I/Os (DQs). The first example shown in FIG. 1a prior art uses a reference bit line (RefBL) 1. Typically, one RefBL is allocated in every 16 or 32 bit lines 2 for each data I/O. It provides the middle current of stored 1 and 0 levels by using either analog circuit design technique or actual cells. There are two types of word lines. For a write operation, the write word line (WWL) by a metal layer carries word line current to generate magnetic filed underneath MTJ in addition to bit line current. A read word line (RWL) is connected to all of 256-512 gates of nMOS cell transistors. Generally, a RWL consists of two layers; the first one is poly-Si layer, which is gate of nMOS cell transistor. The second is one is a metal layer, and this straps poly-Si layer at every 16-32 cells to reduce the resistance of RWL. In a typical MRAM array block, there are 256-1024 WWLs and RWLs. During read, a bit line multiplexing block, Mux, selects one of 16-32 bit lines as the input to a sense amplifier according to an accessed address. The sense amplifier compares the reference current on RefBL with that of the selected bit line.

For a folded bit line structure, a pair of reference word lines (RefWLs) can be used. FIG. 1b prior art shows this scheme as a second example of the conventional MRAM reference In FIG. 1a prior art, a cell transistor gate 4 is placed on every crossing point of bit line 2 and RWL as shown by dots 4. However, in the folded bit line scheme of FIG. 1b prior art, RWL has cell transistor gate 4 on its every second crossing point of bit line 2. Thus, when a bit line is accessed by turning on the cell transistor, its adjacent bit line is not accessed. Therefore, if a Reference Word Line (RefWL) is arranged so that its activation turns on the cell transistor on this un-accessed bit line, this adjacent bit line can be used as the reference bit line. For simplicity, two RefWLs are shown in FIG. 1b prior art, but actually each RefWL consists of two lines, one is connected to a reference cell with stored data 1, and the other to a stored data 0. The data from these two cells are connected to the bit line to supply a sum of stored 1 and 0 current. The current is mirrored to a half to become the reference current for the sense amplifier. If the top RWL of FIG. 1b prior art is selected the cell current on the left edge bit line, the bottom RefWL is turned on to conduct the reference current on the adjacent bit line on right. The multiplexer Mux selects these two bit lines, and the sense amplifier compares the currents on them during the read access.

Both examples shown in FIGS. 1a+b prior art are applicable to the conventional MRAM array architecture that activates one cell among 16-32 cells on the same RWL/WWL for read and write operations. Thus, during writes, only one cell is selected among many surrounding cells, and all unselected cells are subject to half select write disturb either by bit or word write current. It is very difficult to optimize current levels in terms of robustness to write disturb on bit and word directions. This is the well-known major issue of MRAMs.

For this fundamental issue, array architecture to write all of the cells on the same WWL may be regarded as a promising way. Because of no word line disturb, the MTJ shape and bit/word write currents could be optimized by considering bit direction disturb only. FIGS. 7a+b prior art show an example of this architecture. As shown FIG. 7a prior art an array block is segmented by the short WWL with a tail transistor. There is a switch on the source side of Write Word Line. Depending on the accessed address, the chip selects one of the segments choosing the source side switch. A write select line is connected to the gates of all tail transistors. Thus, activating one Write Select Line (WSL) enables the word line write current of 16 or 32 cells in the selected segmented small array only. These 16 or 32 bit lines in each segment provide 16 or 32 I/O data. FIG. 7b prior art illustrates a physical cross section along the bit line. At the very bottom, a poly-Si line, which is connected to gates of 16-32 cell transistors, runs perpendicular to the bit line. This poly-Si line is strapped to a higher-level metal layer at both ends of the segment. Above this strapping metal layer, another higher-level metal runs in parallel as WSL, which is connected to the gate of the tail transistor at one end of the segment. Further above it and just below MTJ, WWL runs in the same direction. At the very top, the bit line runs perpendicularly to all of underneath lines, WWL, WSL, RWL, and poly-Si wire.

In such an architecture, there is no word line write disturb, but since all of the 16 or 32 cells in this one segment need to be read at a time, the conventional reference current circuits shown in FIGS. 1a+b prior art cannot be used. An open bit line scheme is well-known array architecture used in DRAM, and it can be used for the segmented MRAM array. In this open bit-line scheme a block of sense amplifiers is located with multiplexing switches between two identical, mirrored arrays. In each array, two sets of RefWLs are placed at the edge (closer side to sense amplifier) of the array. RefWL consists of the same components as actual memory, WWL, WSL, RWL, and poly-Si line. Each of two RefWLs stores data 1 and 0 respectively to flow the summed current on the bit line, which is mirrored to a half to give the middle level of stored 1 and 0 to become the reference current in the sense amplifier. For a read, when a RWL on the top array is selected, RWLs of two RefWLs on the bottom array is selected. The sense amplifier compares read current from the top array and the reference current from bottom. This open bit line scheme fits the segmented array architecture quite well, but the open bit line scheme has less robustness to noise compared to a folded bit line scheme. Because RWL and RefRWL are placed on different array blocks, noise induced in here is not common-mode generally.

It is a challenge for engineers to realize reference current circuits for reliable sensing operations in segmented MRAM and other memory architectures.

There are known patents or patent publications dealing with sensing operations of MRAM arrays:

U. S. Patent Publication (US 2007/0247939 to Nahas et al.) proposes a magnetoresistive random access memory (MRAM) avoiding difficulties with write disturb by electrically isolating the portion of the array with data from the portion with reference signals while providing fast read speeds by simultaneously enabling the word line having the reference cells and the selected word line. For high speed accessing it is difficult to completely stabilize a precharge prior to beginning the next access. Accordingly, it is desirable for the reference cell and the selected cell to have the same response characteristics because no voltages are truly stationary during high speed accessing. This is achieved by simultaneous accessing and by having matched impedances. Thus, the voltage separation between the reference cell and the selected cell can be maintained even when both are moving even if they are moving in the same direction.

U.S. patent (U.S. Pat. No. 7,453,719 to Sakimura et al.) discloses an MRAM having a plurality of bit lines, a reference bit line, a plurality of memory cells and reference cells and a read section. The memory cells are provided along the bit lines and the reference cells along the reference bit line. The memory cell and reference cell have a tunneling magnetic resistance and a reference tunneling magnetic resistance, each of which has a spontaneous magnetization whose direction is reversed in accordance with data stored therein. The read section has a first resistance section which contains a ninth terminal connected with a bit line and a tenth terminal connected with the first power supply, a second resistance section which contains an eleventh terminal connected with the reference bit line and a twelfth terminal connected with the first power supply, and a comparing section which compares a sense voltage on the ninth terminal and a reference voltage of the eleventh terminal.

U.S. patent (U.S. Pat. No. 6,807,089 to Gogl et al.) discloses a method for operating an MRAM semiconductor memory configuration for the purpose of reading an item of stored information wherein reversible magnetic changes are made to the TMR cell and a current that is momentarily altered as a result is compared with the original read signal. As a result, the TMR memory cell itself can serve as a reference, even though the information in the TMR memory cell is not destroyed, i.e. writing-back does not have to be effected. The method can preferably be applied to an MRAM memory configuration in which a plurality of TMR cells are connected, in parallel, to a selection transistor and in which there is a write line which is not electrically connected to the memory cell.

Furthermore the following publications are dealing with reference lines of MRAM arrays:

M. Durlam et al., "A 1-Mb MRAM Based on 1T1MTJ Bit Cell Integrated With Copper Interconnects", *IEEE Journal of Solid-State Circuits*, vol. 38 no. 5, pp. 769-773, May 2003, J. DeBrosse et al., "A High-Speed 128 Kb MRAM Core for Future Universal Memory Applications", *IEEE Journal of Solid-State Circuits*, vol. 39 no. 4, pp. 678-683, April 2004, N. Sakimura et al., "A 250 MHz 1-Mb Embedded MRAM Macro Using 2T1MTJ Cell with Bit Line Separation and Half-Pitch Shift Architecture", *Proceedings of 2007 IEEE Asian Solid-State Circuits Conference*, pp. 216-219, November 2007, and T. Tsujii et al., "A 1.2V IMbit Embedded MFUM Core with Folded Bit-Line Array Architecture", IEEE Symposium VLSI Circuits Digest of Technical Papers, pp. 450-453 June 2004.

SUMMARY OF THE INVENTION

A principal object of the present invention is to achieve methods and systems for current circuits providing reliable sensing operations in segmented memory architecture.

A further object of the invention is to achieve current circuits providing reliable sensing operations in a segmented MRAM architecture.

A further object of the present invention is to avoid any word line disturb.

A further objective of the invention is to utilize folded bit line or segment-to-segment folded bit line scheme.

In accordance with the objects of this invention a method to realize reference current circuits for reliable sensing operations in segmented memory architecture has been achieved. The method invented comprises, firstly, the following steps: (1) providing a segmented memory array structure comprising Poly-Si Read Word lines, Write Select Lines, Write Word lines, bit lines, a multiplexer, sense amplifiers, and reference word lines, (2) applying a folded bit line or a segment-to-segment folded bit line scheme to array structure, and (3) deploying two pairs of Reference Word Lines, wherein a first line of each pair is connected to cells with stored data 0 and a second line of each pair is connected to cells with stored data 1. Furthermore the method invented comprises the steps of: (4) selecting a first pair of Reference Word to supply reference and read currents on two bit lines adjacent to the cells to be read if an even read word line is selected to read correspondent cells, and (5) selecting a second pair of Reference Word Line to supply reference and read currents on two bit lines adjacent to the cells to be read if an odd read word line is selected to read correspondent cells, and a sense amplifier is connected to the two adjacent bit lines to compare the reference and supply current.

In accordance with the objects of this invention a semiconductor memory array having a reference circuit for a segmented array structure exploiting a folded bit line scheme for better noise immunity has been achieved. The memory array invented comprises: two pairs of Reference Word Lines, wherein a first pair is for even Read Word Lines, a second pair is for odd Read Word lines, and wherein each pair connects to cells with stored data 1 and 0, poly-Si word Lines, and bit lines deployed in a folded bit-line scheme.

BRIEF DESCRIPTION OF THE DRAWINGS

In the accompanying drawings forming a material part of this description, there is shown:

FIG. 1*a* prior art shows a conventional MRAM Array structure in regard of a reference bit line.

FIG. 1*b* prior art shows a conventional MRAM Array structure in regard of a reference bit line.

DESCRIPTION OF THE PREFERRED EMBODIMENTS

Four preferred embodiments of the present invention to provide reliable reference currents for MRAM read access are disclosed. It has to be understood that the present invention is not limited to be applied to MRAM only, it can be applied to any memory that needs to access on small, segmented arrays. All four preferred embodiments of the invention have in common that they are utilizing a folded bit line scheme. Making a folded bit line structure is a key point of the present invention because noise to be generated on folded bit lines during sensing becomes common mode generally, and thus this noise does not affect sensing when it is done to detect as a differential signal.

Figure 2:
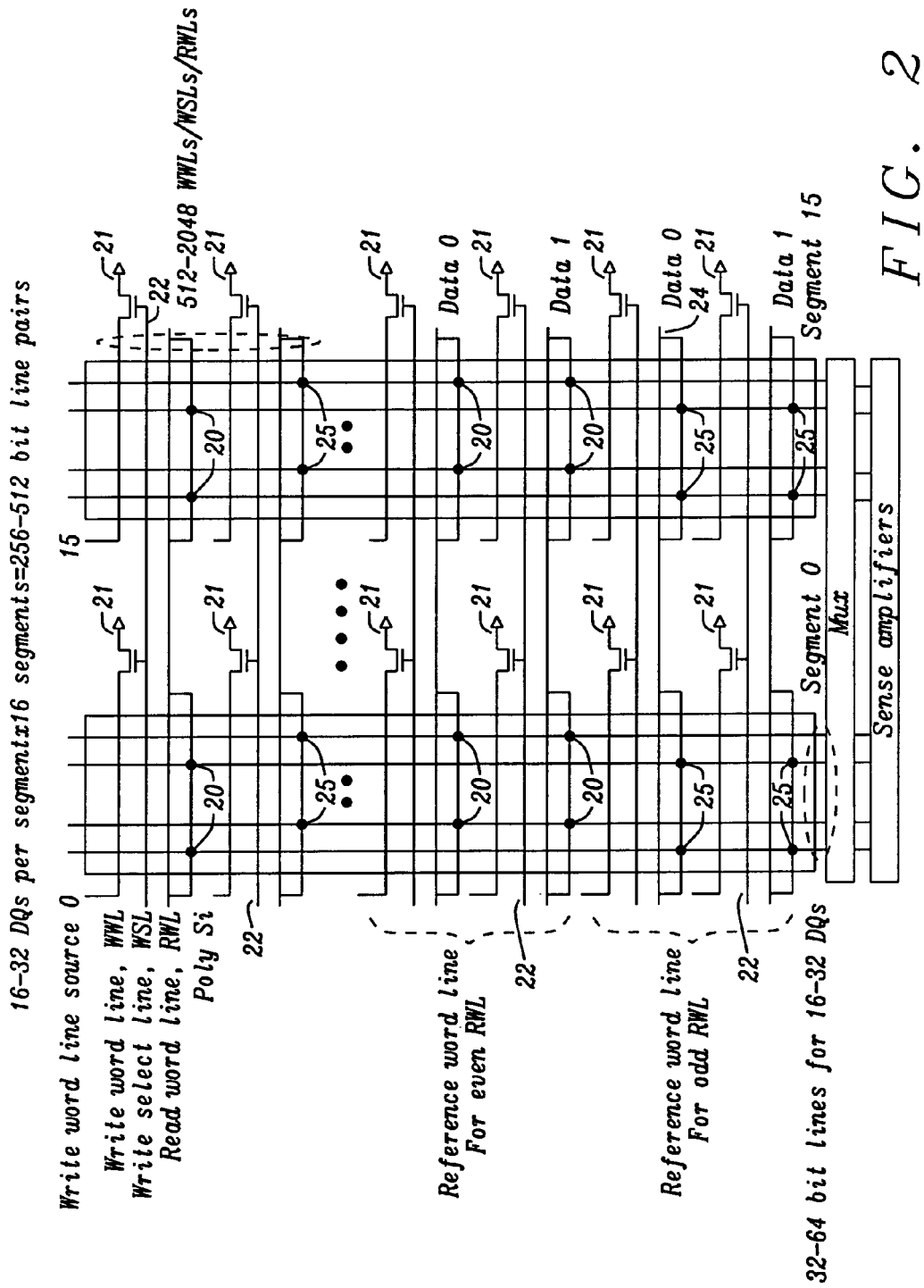
FIG. 2 shows a first embodiment of the present invention illustrating a folded bit line scheme for a segmented MRAM array structure.

FIG. 2 shows a first embodiment of the present invention. It illustrates a MRAM array block comprising 16 segments with a reference circuit for a segmented MRAM array structure. For better noise immunity, it exploits a folded bit line scheme. In this first embodiment the bit lines are folded in pair-like adjacent bit lines. Furthermore 16-32 I/O data lines DQ are deployed per segment. If e.g. 16 segments are deployed then 16 or 32 times 16=256 or 512 bit lines are required. These numbers of DQ and of segments are examples only; other numbers would be possible also.

Each array block is segmented by a short write word line (WWL) with a tail transistor 21. There is a switch on the source side of WWL. Depending on the accessed address, the chip selects one of the segments choosing a corresponding source side switch. A Write Select line (WSL) 22 is connected to the gates of all tail transistors 21. Thus, activating one WSL enables the word line write current of 16 or 32 cells in the selected segmented small array only. Physically there are four reference word lines (RefWLs), i.e. two pairs 23 and 24 of RefWLs, and each pair 23/24 connects to cells with stored data 1 and 0. When an even read word line (RWL) is selected to read cells 20, a first pair of RefWLs 23 is selected to supply the reference and read currents on the two adjacent bit lines, and a sense amplifier is connected to the two bit lines to compare the currents. When an odd read word line (RWL) is selected to read the correspondent cells, a second pair of RefWLs 24 is selected to supply the reference and read currents on the two adjacent bit lines, and the sense amplifiers is connected to the two bit lines to compare the currents. Summarizing, cells 20 are located on even word line, while cells 25 on odd. Thus, when the even cells 20 are read 'RWL for even RWL' must be selected. Likewise, when the odd cells 25 are read, 'RWL for odd RWL' must be activated. This scheme gives the best noise immunity.

Figure 3:
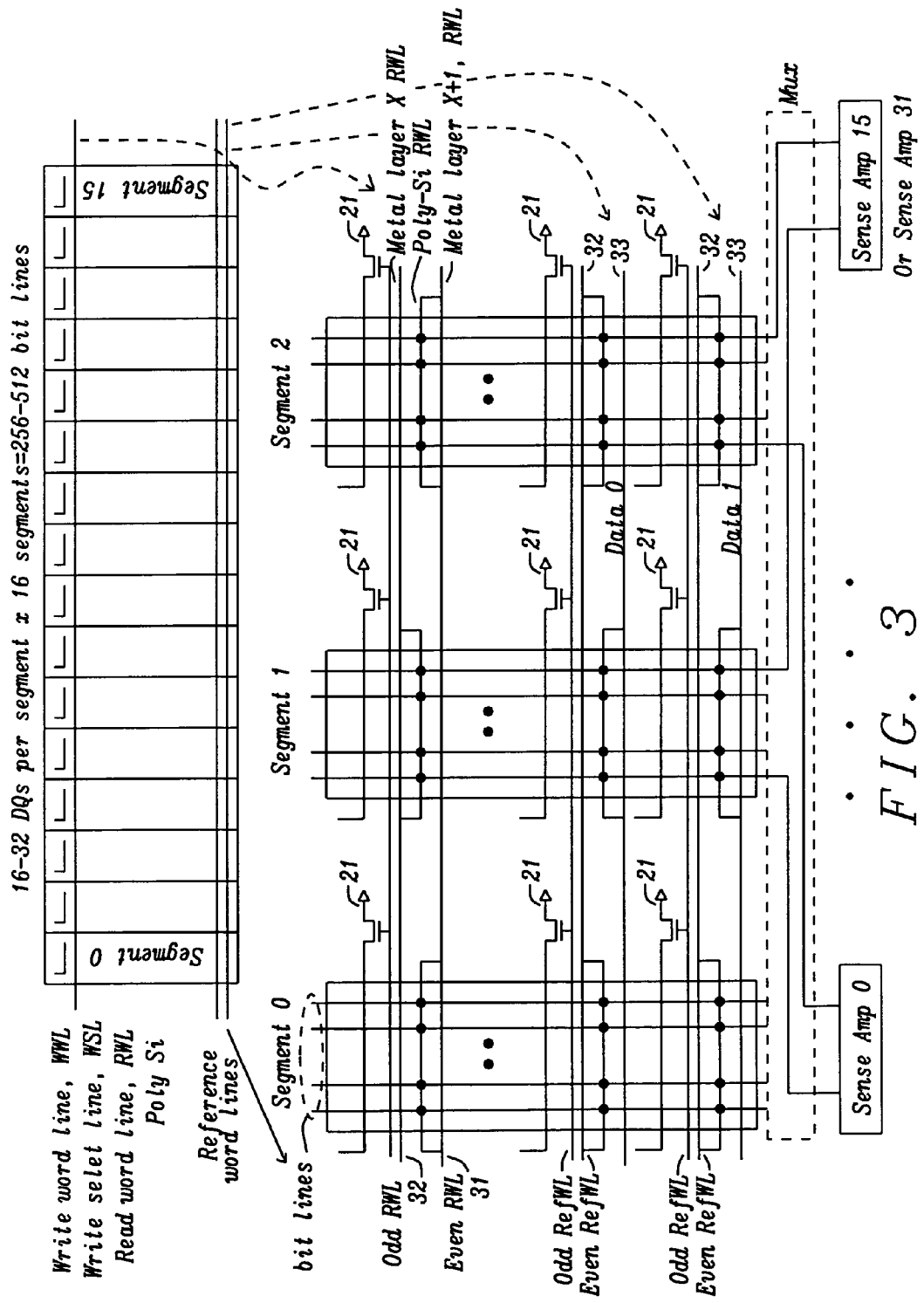
FIG. 3 shows a second embodiment of the invention illustrating a segment-to-segment folded bit line scheme for a segmented MRAM Array structure.

In order to reduce cell area required, a second embodiment of the invention is proposed in FIG. 3. FIG. 3 shows a segment-to-segment folded bit line scheme for a segmented MRAM array structure The bit line is folded in adjacent segment, not in pair-like adjacent bit lines as shown in FIG. 2. Thus, it can be called segment-to-segment folded bit line. The scheme assumes one additional metal layer to strap poly-Si word line.

Two metal layers, X and X+1, alternately strap poly-Si word line in every other segment as shown in FIG. 3.

To read e.g. 16 or 32 cells in an odd-numbered segment, as e.g. segment 1, an odd RWL 30 is activated to put read cell current on bit lines in segment 1. Two odd RefWLs 32 are selected to flow a sum of stored 1 and 0 currents on bit lines in segment 2, which are mirrored to a half to be used as the reference currents in the sense amplifiers. Multiplexer Mux selects connections so that every sense amplifier has the read current from segment 1 and the reference current from segment 2.

To read 16 or 32 cells in an even-numbered segment, as e.g. segment 2, an even RWL 31 is activated to put read cell current on bit lines in segment 2. Two even RefWLs 33 are selected to flow a sum of stored 1 and 0 currents on bit lines in segment 3, which are mirrored to a half to be used as the reference currents in the sense amplifiers. Multiplexer Mux selects connections so that every sense amplifier has the read current from segment 2 and the reference current from segment 3. It should be noted that read and reference segments have to be adjacent to each other and right or left is arbitrary. Either right or left is can be used as edge segment.

Since there are cells on every cross-point of bit and word lines, the cell area is the same as the conventional one-transistor and one-magnetic tunnel junction (1T1MTJ) bit cell. Although the bit lines to be used for sensing is no longer adjacent pair, they are on the same array block, one segment away, and RefWLs are also on the same array block as RWL. Thus, comparable noise immunity can be achievable as the folded bit line scheme.

Figure 4:
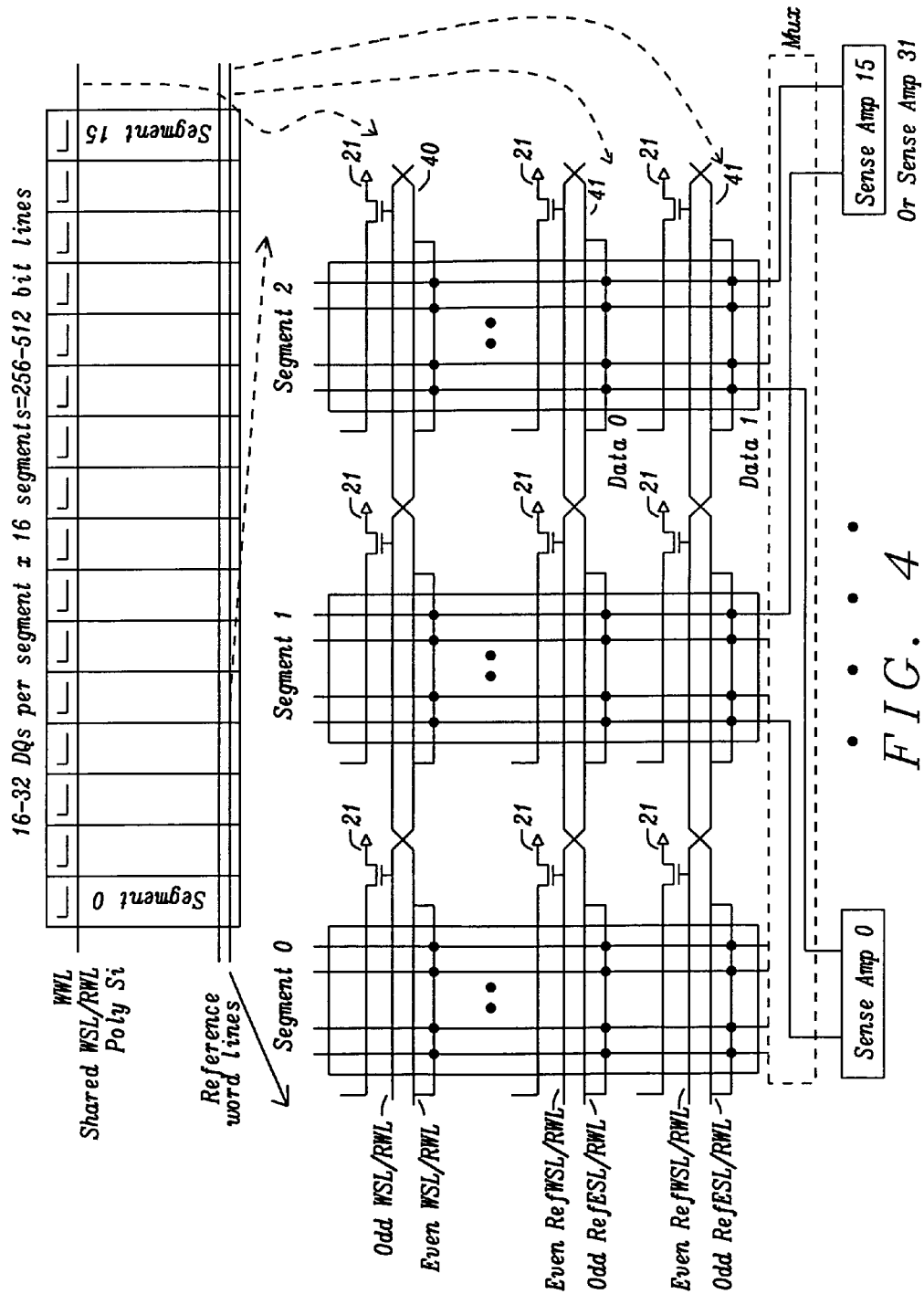
FIG. 4 shows a third embodiment of the present invention illustrating shared WSU RSL plus two reference word lines for a segmented MRAM Array structure.

The third invention is shown in FIG. 4, illustrating shared WSU RSL plus two reference word lines for a segmented MRAM Array structure. The embodiment of FIG. 4 is also based on the segment-to-segment folded bit line structure, but it does not need the additional metal layer to strap poly-Si word lines in every other segment as outlined above for the embodiment of FIG. 3. The alternate strapping of poly-Si word line in every other segment is done by metal layer RWL and WSL. Thus, RWL and WSL are shared. For example, an odd WSL/RWL 40 is WSL in segment 0, but it becomes RWL in segment 1, and WSL in segment 2, etc.

During write of segment 0, WSL becomes high to turn on the tail transistor 21, and the write word line current flows in this segment. The high voltage on WSL also comes to segments 1, 3, 5, - - - 15 as the cell transistor gate voltage to work as RWL, but all of bit lines on unselected segments are grounded. To read 16 or 32 cells in segment 1, the odd WSL/RWL 40 becomes high. This word line becomes WWL in segment 0, but WWL source node is shut off to result in no write current in here. In this read, the two odd RefWSL/RWLs 41 are activated to put a sum of stored 1 and 0 currents on bit lines of segment 2. In the same way as the second embodiment of the invention shown in FIG. 3, the sense amplifiers compare read cell currents in segment 1 with the reference currents from segment 2, which are mirrored to a half from the sum of stored 1 and 0 currents.

Figure 5:
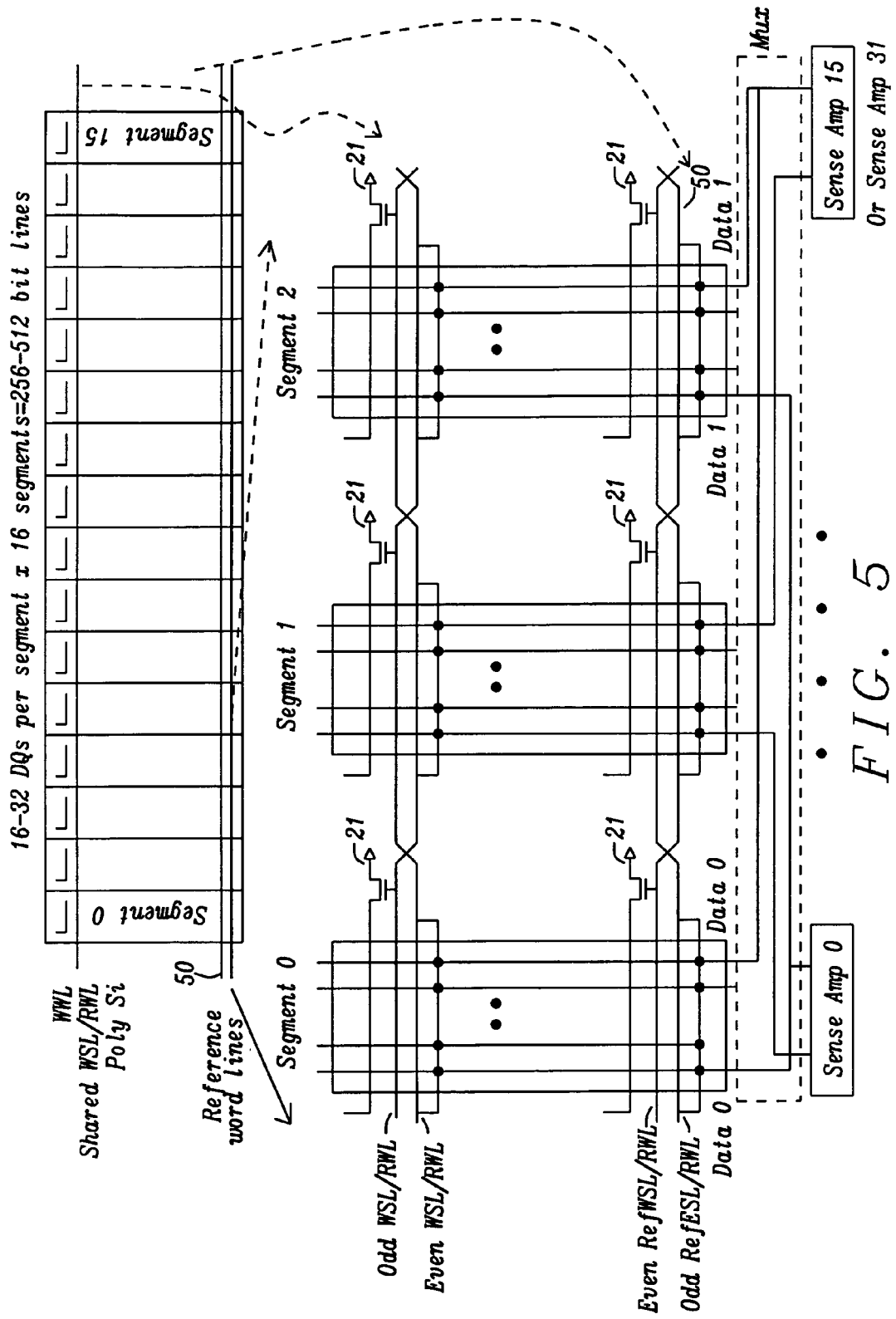
FIG. 5 shows a fourth embodiment of the present invention illustrating shared WSU RSL plus one reference word line for a segmented MRAM Array structure.

The fourth embodiment of the invention shown in FIG. 5, illustrating shared WSL/RSL plus one reference word line 50 for a segmented MRAM array structure. It is a modified version of the third embodiment of the invention shown in FIG. 4. Instead of two sets of RefWSL/RWL pair as shown in FIG. 4 it has only one set of a RefWSL/RWL pair 50.

Namely, it has stored 1 and 0 cells on both sides of the selected segment. When segment 1 is selected for the read access, segment 0 with stored data 0 and segment 2 with stored data 1 provides currents to be used as reference.

In order to read cells in edge segment 0, those in segments 1 and 3 are used as reference cells. Likewise for reading cells in edge segment 15, cells in segments 12 and 14 are used as reference cells.

All of inventions are described to provide reliable reference currents for MRAM read accesses. However, it does not necessarily mean to limit to MRAM only, and it can be used for any memory that needs to access on small, segmented arrays.

Figure 6:
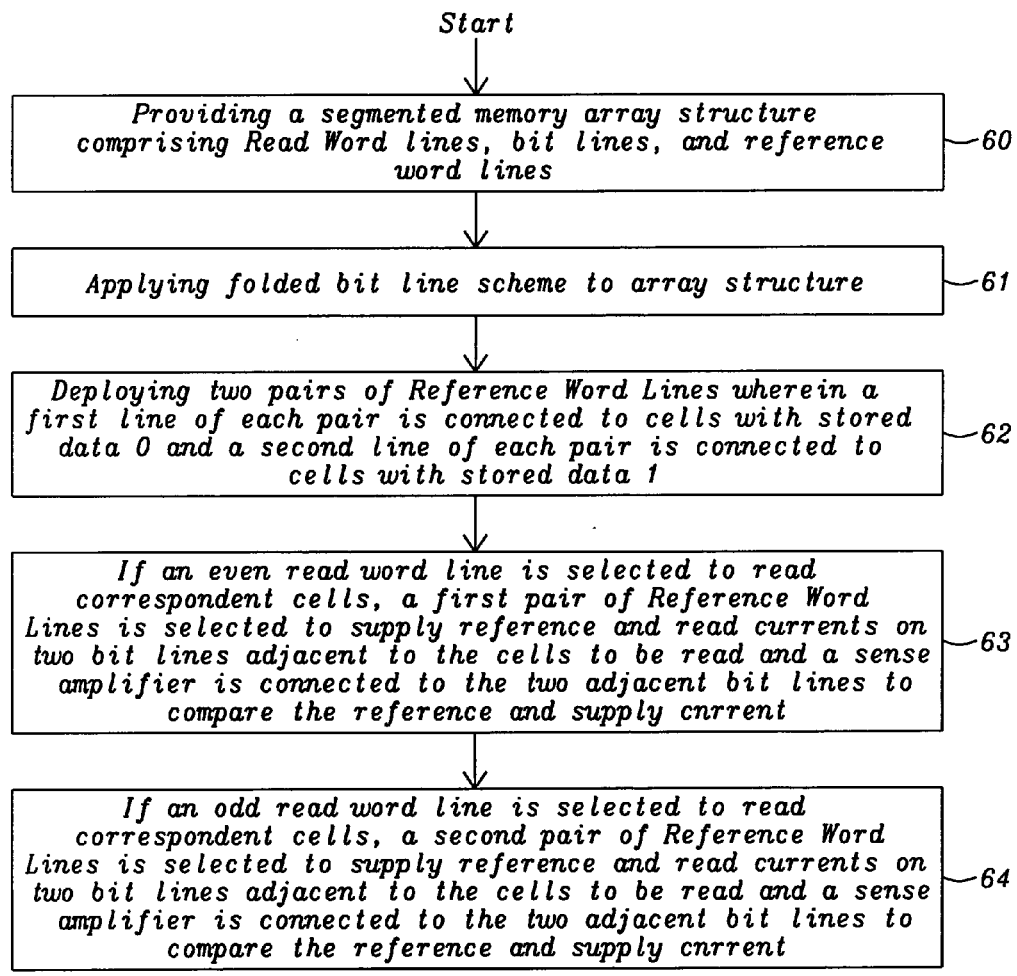
FIG. 6 illustrates a flowchart of a method invented to achieve reliable sensing operations for semiconductor memories and to enhance the yield of the semiconductor memories.
Figures 7A, 7B:
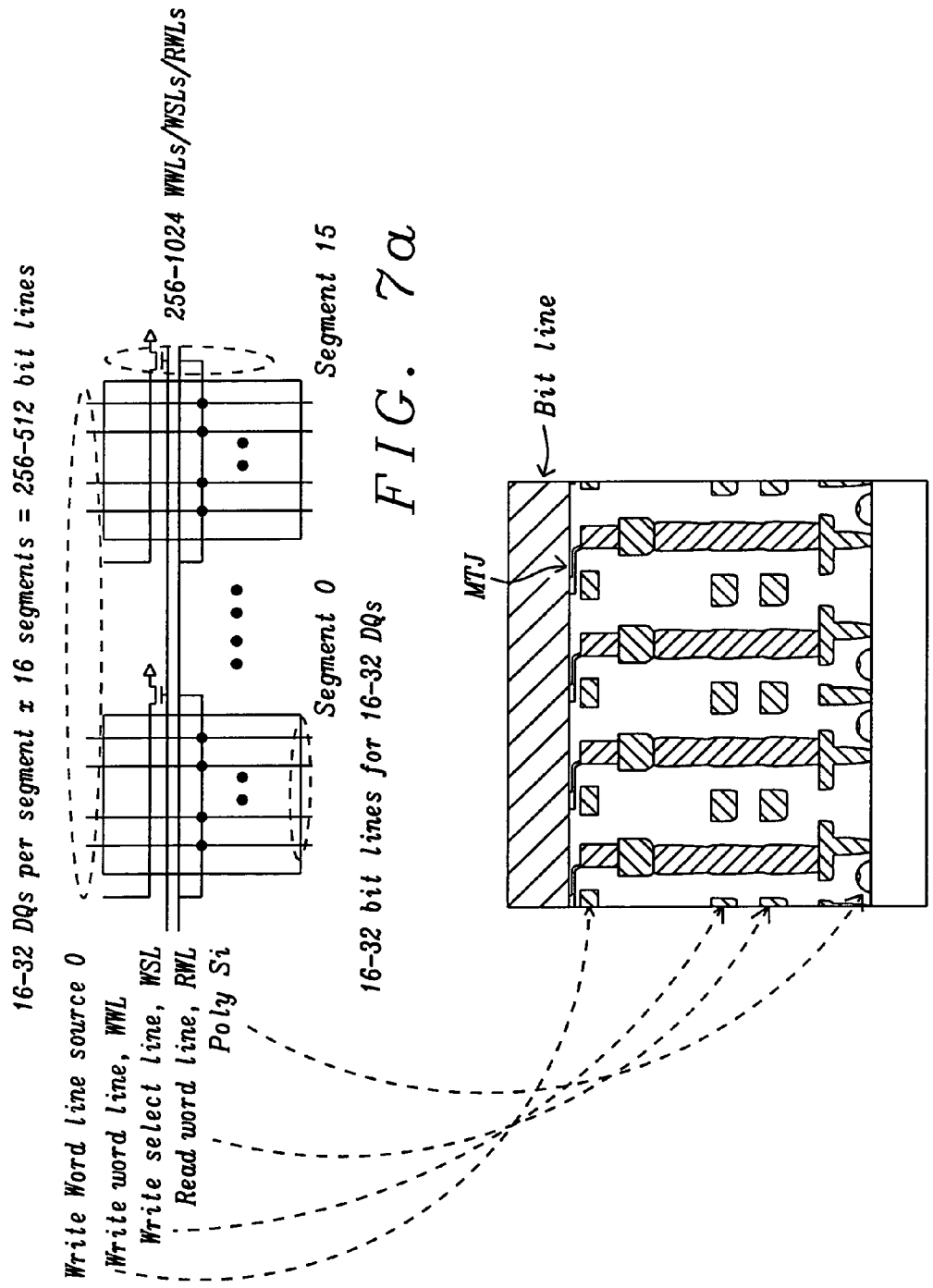
FIG. 7a prior art depicts an array block, segmented by a short Write Word Line with a tail transistor.
FIG. 7b prior art illustrates a physical cross section along the bit line.

FIG. 6 illustrates a flowchart of a method invented to provide reliable reference currents for memory read accesses utilizing a folded bit line scheme.

Step 60 of the method of FIG. 6 illustrates the provision of a segmented memory array structure comprising Read Word Lines, Bit Lines, Write Select Lines, Write Word lines, Read Word Lines, a multiplexer, sense amplifiers, and Reference Word Lines. It could be an MRAM memory or any other requiring access on small, segmented arrays. Step 61 describes applying folded bit line scheme to the memory array structure. Step 62 illustrates deploying two pairs of Reference Word Lines, wherein a first line of each pair is connected to cells with stored data 0 and a second line of each pair is connected to cells with stored data 1. Step 63 depicts selecting a first pair of Reference Word to supply reference and read currents on two bit lines adjacent to the cells to be read if an even read word line is selected to read correspondent cells, and a sense amplifier is connected to the two adjacent bit lines to compare the reference and supply currents and step 64 illustrates selecting a second pair of Reference Word Line to supply reference and read currents on two bit lines adjacent to the cells to be read if an odd read word line is selected to read correspondent cells, and a sense amplifier is connected to the two adjacent bit lines to compare the reference and supply current.

While the invention has been particularly shown and described with reference to the preferred embodiments thereof, it will be understood by those skilled in the art that various changes in form and details may be made without departing from the spirit and scope of the invention.

What is claimed is:

1. A method to realize reference current circuits for reliable sensing operations in segmented memory architecture, comprising the following steps:
    (1) providing a segmented memory array structure comprising Poly-Si Read Word lines, Write Select Lines, Write Word lines, bit lines, a multiplexer, sense amplifiers, and reference word lines;
    (2) applying a folded bit line scheme to array structure;
    (3) deploying two pairs of Reference Word Lines, wherein a first line of each pair is connected to cells with stored data 0 and a second line of each pair is connected to cells with stored data 1;
    (4) selecting a first pair of Reference Word to supply reference and read currents on two bit lines adjacent to the cells to be read if an even read word line is selected to read correspondent cells; and
    (5) selecting a second pair of Reference Word Line to supply reference and read currents on two bit lines adjacent to the cells to be read if an odd read word line is selected to read correspondent cells, and a sense amplifier is connected to the two adjacent bit lines to compare the reference and supply current.

2. The method of claim 1 wherein the semiconductor memory is a Magnetic Random Access Memory (MRAM).

3. The method of claim 1 wherein the bit lines are folded in pair-like adjacent bit lines.

4. The method of claim 1 wherein the bit lines are folded in segment-to-segment folded bit lines.

5. The method of claim 4 wherein each Poly-Si Read Word Line is strapped by an own metal layer and two metal layers alternately strap poly-Si word line in every other segment.

6. The method of claim 4 wherein reading cells in any odd-numbered segment comprises steps of:
    activating an odd Read Word Line to put a read cell current on bit lines in said odd-numbered segment;
    selecting two odd reference word lines to select a flow of stored 1 and 0 currents on bit lines of an adjacent segment;
    mirroring said 1 and 0 currents to a half to be used as reference currents by the sense amplifiers; and
    selecting connections by the multiplexer so that every sense amplifier has a read current from said odd-numbered segment and the reference current from said adjacent segment.

7. The method of claim 4 wherein reading cells in any even-numbered segment comprises steps of:
    activating an even Read Word Line to put a read cell current on bit lines in said even-numbered segment;
    selecting two even reference word lines to select a flow of stored 1 and 0 currents on bit lines of an adjacent segment;
    mirroring said 1 and 0 currents to a half to be used as reference currents by the sense amplifiers; and
    selecting connections by the multiplexer so that every sense amplifier has a read current from said even-numbered segment and the reference current from said adjacent segment.

8. The method of claim 4 wherein an alternate strapping of poly-Si Word Lines is performed in every other segment by metal layers of the Read Word lines and Write Select Lines.

9. The method of claim 8 wherein the Read Word Lines and the Write Select Lines are shared.

10. The method of claim 9 wherein an odd Write Select Line/Read Word line can be a Write Select Line in every even-numbered segment and can be a Read Word line in every odd-numbered segment.

11. The method of claim 9 wherein an even Write Select Line/Read Word line can be a Write Select Line in every odd-numbered segment and can be a Read Word line in every even-numbered segment.

12. The method of claim 9 wherein two pairs of Reference Write Select Lines/Read Word Lines are deployed.

13. The method of claim 9 wherein an even Write Select Line/Read Word line can be a Write Select Line in every odd-numbered segment and can be a Read Word line in every even-numbered segment.

14. The method of claim 9 wherein writing in any even-numbered segment comprises steps of:
    setting Write Select Line high to turn a correspondent tail transistor ON of said even-numbered segment and Write Word Line current flows into said even-numbered segment; and
    grounding of all bit lines of unselected even-numbered segments.

15. The method of claim 9 wherein writing in any odd-numbered segment comprises steps of:
    setting Write Select Line high to turn a correspondent tail transistor ON of said odd-numbered segment and Write Word Line current flows into said odd-numbered segment; and grounding of all bit lines of unselected, odd-numbered segments.

16. The method of claim 9 wherein reading cells in any even-numbered segment comprises steps of:
setting an odd Write Select Line/Read Word Line high, this Write Select Line/Read Word Line becomes a Word Write Line in said even-numbered segment, and a Write Word Line source node is shut off to prevent a Write Line current;
selecting two odd shared Reference Write Select Lines/Read Word Lines to select a flow of stored 1 and 0 currents on bit lines of an adjacent segment;
mirroring said 1 and 0 currents to a half to be used as reference currents by the sense amplifiers; and
selecting connections by the multiplexer so that every sense amplifier has a read current from said even-numbered segment and the reference current from said adjacent segment.

17. The method of claim 9 wherein only one pair of Reference Write Select Lines/Read Word Lines is deployed.

18. The method of claim 17 wherein cells with stored 1 currents are stored on a segment on a first side to the segment, where a cell to be read is located, and cells with stored 0 currents are stored on a segment on a second side to the segment where a cell to be read is located.

19. A semiconductor memory array having a reference circuit for a segmented array structure exploiting a folded bit line scheme for better noise immunity comprises:
two pairs of Reference Word Lines, wherein a first pair is for even Read Word Lines, a second pair is for odd Read Word lines, and wherein each pair connects to cells with stored data 1 and 0;
Write sense lines;
poly-Si Word Lines; and
Bit lines deployed in a folded bit-line scheme.

20. The semiconductor memory array of claim 19 wherein the memory array has 16 segments.

21. The semiconductor memory array of claim 19 wherein the memory array is a Magnetic Random Access Memory (MRAM).

22. The semiconductor memory array of claim 19 wherein the memory array comprises bit lines that are folded in pair-like adjacent bit lines.

23. The semiconductor memory array of claim 19 wherein the memory array comprises bit lines that are folded in adjacent segment.

24. The semiconductor memory array of claim 23 wherein the memory array comprises two metal layers wherein each of said two metal layers is alternately strapping Poly-Si Word Line in every other segment.

25. The semiconductor memory array of claim 24 wherein the memory array comprises additionally a metal layer to strap said poly-Si Word Lines.

26. The semiconductor memory array of claim 19 wherein Read Word Lines and Write Sense Lines are shared.

27. The semiconductor memory array of claim 26 wherein said sharing is achieved by alternate strapping of poly-Si Word Line in every other segment by metal layer Read Word Line and Write Select Line.

28. The semiconductor memory array of claim 26 wherein only one pair of Reference Write Select Line/Read Word Line is deployed.

29. The semiconductor memory array of claim 28 wherein cells with stored 1 currents are stored on a segment on a first side to the segment, where a cell to be read is located, and cells with stored 0 currents are stored on a segment on a second side to the segment where a cell to be read is located.

* * * * *